US008668961B2

(12) United States Patent
Varaprasad

(10) Patent No.: US 8,668,961 B2
(45) Date of Patent: Mar. 11, 2014

(54) TITANIA COATING AND METHOD OF MAKING SAME

(75) Inventor: Desaraju V. Varaprasad, Ann Arbor, MI (US)

(73) Assignee: Guardian Industries Corp., Auburn Hills, MI (US)

(*) Notice: Subject to any disclaimer, the term of this patent is extended or adjusted under 35 U.S.C. 154(b) by 627 days.

(21) Appl. No.: 12/222,070

(22) Filed: Jul. 31, 2008

(65) Prior Publication Data
US 2010/0024874 A1 Feb. 4, 2010

(51) Int. Cl.
C08F 2/48 (2006.01)
C08F 2/54 (2006.01)

(52) U.S. Cl.
USPC ........... 427/487; 427/496; 427/503; 427/508; 427/515

(58) Field of Classification Search
USPC ............... 427/407.1, 493, 496, 503, 508, 515
See application file for complete search history.

(56) References Cited

U.S. PATENT DOCUMENTS

| 4,510,344 | A | | 4/1985 | Berman |
|---|---|---|---|---|
| 4,543,133 | A | * | 9/1985 | Mukai ........................... 117/73 |
| 4,545,823 | A | * | 10/1985 | Drowley ...................... 438/481 |
| 4,792,536 | A | | 12/1988 | Pecoraro et al. |
| 4,806,436 | A | | 2/1989 | Tada et al. |
| 4,816,333 | A | | 3/1989 | Lange et al. |
| 4,830,879 | A | | 5/1989 | Debsikdar |
| 5,214,008 | A | | 5/1993 | Beckwith et al. |
| 5,401,287 | A | | 3/1995 | Pecoraro et al. |
| 5,480,722 | A | | 1/1996 | Tomonaga et al. |
| 5,672,243 | A | * | 9/1997 | Hsia et al. ..................... 430/313 |
| 5,744,227 | A | | 4/1998 | Bright et al. |
| 5,783,049 | A | | 7/1998 | Bright et al. |
| 5,830,252 | A | | 11/1998 | Finley et al. |
| 5,883,030 | A | | 3/1999 | Bako et al. |
| 5,948,131 | A | | 9/1999 | Neuman |
| 5,964,962 | A | | 10/1999 | Sannomiya et al. |
| 5,977,477 | A | | 11/1999 | Shiozaki |
| 6,284,377 | B1 | | 9/2001 | Veerasamy |
| 6,303,225 | B1 | | 10/2001 | Veerasamy |
| 6,372,327 | B1 | | 4/2002 | Burnham et al. |
| 6,403,509 | B2 | | 6/2002 | Cochran et al. |
| 6,407,021 | B1 | | 6/2002 | Kitayama et al. |
| 6,495,482 | B1 | | 12/2002 | de Sandro et al. |

(Continued)

FOREIGN PATENT DOCUMENTS

| EP | 1 329 433 | 7/2003 |
|---|---|---|
| JP | 07-122764 | 5/1995 |
| JP | 11-60269 | 3/1999 |

OTHER PUBLICATIONS

U.S. Appl. No. 11/122,218, filed May 5, 2005, Thomsen et al.

(Continued)

Primary Examiner — Elena T Lightfoot
(74) Attorney, Agent, or Firm — Nixon & Vanderhye P.C.

(57) ABSTRACT

Methods of making titania coatings having self cleaning properties, and associated articles are provided. In certain example instances, a substrate supports a layer comprising titanium dioxide. The substrate may support multiple layers. In certain examples, the titanium dioxide layer is made using a process involving a titania precursor and a photomonomer. The titanium dioxide coating may be applied as a liquid directly or indirectly on a substrate, then permitted to cure. After curing using ultraviolet radiation and/or electron beams, the resulting coating may inhibit fouling, be antireflective, be highly durable, self cleaning and/or hydrophilic in certain instances.

12 Claims, 3 Drawing Sheets

(56) References Cited

U.S. PATENT DOCUMENTS

| | | |
|---|---|---|
| 6,498,118 B1 | 12/2002 | Landa et al. |
| 6,503,860 B1 | 1/2003 | Dickinson et al. |
| 6,506,622 B1 | 1/2003 | Shiozaki |
| 6,521,558 B2 | 2/2003 | Landa et al. |
| 6,573,207 B2 | 6/2003 | Landa et al. |
| 6,576,349 B2 | 6/2003 | Lingle et al. |
| 6,592,992 B2 | 7/2003 | Veerasamy |
| 6,610,622 B1 | 8/2003 | Landa et al. |
| 6,716,780 B2 | 4/2004 | Landa et al. |
| 6,723,211 B2 | 4/2004 | Lingle et al. |
| 6,723,487 B2 * | 4/2004 | Minami et al. ............ 430/270.1 |
| 6,749,941 B2 | 6/2004 | Lingle |
| 6,776,007 B2 | 8/2004 | Hirota et al. |
| 6,787,005 B2 | 9/2004 | Laird et al. |
| 6,796,146 B2 | 9/2004 | Burnham |
| 6,846,760 B2 | 1/2005 | Siebers et al. |
| 6,878,403 B2 | 4/2005 | Veerasamy et al. |
| 6,881,530 B1 * | 4/2005 | Mendoza .................. 430/270.1 |
| 6,887,575 B2 | 5/2005 | Neuman et al. |
| 6,936,347 B2 | 8/2005 | Laird et al. |
| 6,974,630 B1 | 12/2005 | Stachowiak |
| 7,012,115 B2 | 3/2006 | Asahina et al. |
| 7,033,649 B2 | 4/2006 | Veerasamy |
| 7,081,302 B2 | 7/2006 | Lemmer et al. |
| 2002/0090519 A1 | 7/2002 | Kursawe et al. |
| 2002/0122962 A1 | 9/2002 | Arfsten et al. |
| 2003/0179476 A1 | 9/2003 | Kobayashi et al. |
| 2004/0028918 A1 | 2/2004 | Becker et al. |
| 2004/0058079 A1 | 3/2004 | Yamada et al. |
| 2004/0121896 A1 | 6/2004 | Landa et al. |
| 2004/0209757 A1 | 10/2004 | Landa et al. |
| 2004/0248995 A1 | 12/2004 | Glaubitt et al. |
| 2004/0258929 A1 | 12/2004 | Glaubitt et al. |
| 2005/0195486 A1 | 9/2005 | Sasaki et al. |
| 2006/0019114 A1 | 1/2006 | Thies et al. |

OTHER PUBLICATIONS

U.S. Appl. No. 11/049,292, filed Feb. 3, 2005, Thomsen et al.
"Colored Glasses" Weyl; The Society of Glass Technology 1951, (4pgs).
"Colour Generation and Control in Glass", Bamford, Glass Science and Technology, 2, 1977 (3pgs).
"Photovoltaic Module Performance and Durability Following Long-Term Field Exposure", King et al., Sandia National Laboratories, (19pgs).
"Antireflection of Glazings for Solar Energy Applications", Nostell et al., Solar Energy Materials and Solar Cells 54 (1988) pp. 223-233.
"Anti-reflection (AR) Coatings Made by Sol-Gel Process: A Review", Chen, Solar Energy Materials and Solar Cells 68 (2001) pp. 313-336.
"Silica Antireflective Films on Glass Produced by the Sol-Gel Method", Bautista et al., Solar Energy Materials and Solar Cells 80 (2003) pp. 217-225.
U.S. Appl. No. 11/701,541, filed Feb. 2, 2007, Sharma et al.
U.S. Appl. No. 11/790,813, filed Apr. 27, 2007, Varaprasad et al.
U.S. Appl. No. 11/902,072, filed Sep. 18, 2007, Varaprasad.
U.S. Appl. No. 11/637,940, filed Dec. 13, 2006, Sharma.

* cited by examiner

TITANIA COATING AND METHOD OF MAKING SAME

Certain example embodiments of this invention relate to titania coatings. In certain example embodiments of this invention, such coatings may be used in photovoltaic devices, antifog mirrors, storefront windows, display cases, picture frames, greenhouses, other types of windows, or in any other suitable application.

BACKGROUND AND SUMMARY OF PREFERRED EMBODIMENTS

Antireflective coatings may be useful for photovoltaic devices and other applications in which reflection of electromagnetic radiation is preferably avoided. Titania-based coatings may be used, although they occasionally may suffer from possible disadvantages, such as instability of coating solutions or sols.

Conventional wet chemical methods to produce titania coatings may use sol-gel processes involving hydrolysis and/or condensation reactions of titanium alkoxides. Titania coatings that are formed from these sols are generally fired at elevated temperatures to convert the precursor compounds into titanium dioxide coatings. In many instances, titania sols are aged for several hours after they are prepared in order to ensure thorough hydrolysis of precursor alkoxides.

The stability of titania sols may be affected by several factors, including pH, water content, concentration of solids, etc. Chelating ligands, such as 2,4-pentanedione may be added to titania sols so as to prolong their shelf life.

Producing stable sols in volumes required for mass production may be challenging. While the shelf life of titania sols may be influenced by storage and transportation conditions, the useful pot life during processing may be affected by the loss of volatiles, exposure to humidity (e.g., ambient humidity), etc. During thermal processing of coatings, heating profiles of gradual temperature ramp rates may be employed to promote condensation and cross-linking reactions. Coatings may be fired at high temperatures to burn off organic content and form titanium dioxide coatings.

Thus, there may be a need for a method to produce stable titania precursor formulations, which may remain largely unaffected by variations in temperature and humidity during storage, transportation, and processing. There may also be a need for a method by which titania coatings could be formed without the need for initial thermal processing prior to high temperature densification. There may also be a need for a method by which titania precursor coatings may be stored and fired on demand to produce titania coatings.

Hydrophilic coatings (e.g., coatings with a low contact angle) may be useful for self-cleaning surfaces as well as in anti-fog and/or anti-mist applications. Antireflective coatings may be useful for photovoltaic devices and other applications in which reflection of electromagnetic radiation is preferably avoided.

Photovoltaic devices such as solar cells (and modules therefor) are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be of glass, and the photoelectric transfer film (typically semiconductor) is for converting solar energy to electricity. Example solar cells are disclosed in U.S. Pat. Nos. 4,510,344, 4,806,436, 6,506,622, 5,977,477, and JP 07-122764, the disclosures of which are hereby incorporated herein by reference.

For photovoltaic (PV) applications—that is, in applications involving photovoltaic modules—the reflection of glass is preferably minimized. It is clear the power output of the module is dependant upon the amount of light (e.g., the number of photons) within the solar spectrum that passes through the glass and reaches the PV semiconductor. Therefore, numerous attempts have been made to try to boost overall solar transmission through glass used in PV-modules.

One attempt relates to the use of iron-free or "clear" glass, which may increase the amount of solar light transmission when compared to regular float glass, through absorption minimization. Solar transmission may be further increased by the use of an antireflective (AR) coating on the first surface of the glass. Porous silica has been used as an AR coating on a glass substrate. But AR coatings derived from porous silica may be difficult to keep clean due to the possible a presence of a large amount of pores in structure.

Therefore, there may be a need to include a antireflective coating. Such a coating may be highly durable and/or self cleaning and/or hydrophilic and may be used as a PV superstrate.

In an example embodiment of this invention, there is provided a method of making a coated article including a coating. The method may comprise mixing a photomonomer comprising at least one radiation curable monomer capable of polymerization through exposure to ultraviolet radiation or electron beams with a titanium alkoxide to form a mixture; and applying the mixture directly or indirectly on a substrate and curing the mixture through exposure to ultraviolet radiation or electron beams after its application so as to form a titanium dioxide layer on the substrate.

In an example embodiment of this invention, there is a coated article comprising a substrate and a titanium dioxide coating, wherein the titanium dioxide coating comprises a layer comprising a polymerized photomonomer and titanium dioxide.

In an example embodiment of this invention, there is provided a method of making a photovoltaic device including a titania-based coating. The method may comprise: mixing a photomonomer comprising at least one radiation curable monomer capable of polymerization through exposure to ultraviolet radiation or electron beams with a titanium alkoxide to form a mixture; applying the mixture directly or indirectly on a glass substrate; curing the mixture through exposure to ultraviolet radiation or electron beams after its application; firing the coating layer in an oven at a temperature of from about 550 to 700° C. for a duration of from about 1 to 10 minutes; and using the glass substrate with the coating layer thereon as a front glass substrate of the photovoltaic device so that the titania-based coating is provided on a light incident side of the glass substrate.

In an example embodiment of this invention, there is provided a method of making a photovoltaic device comprising: a photovoltaic film, and at least a glass substrate on a light incident side of the photovoltaic film; an antireflection coating provided on the glass substrate; wherein the antireflection coating comprises at least a layer produced using a method comprising the steps of: mixing a photomonomer comprising at least one radiation curable monomer capable of polymerization through exposure to ultraviolet radiation or electron beams with a titanium alkoxide to form a mixture; applying the mixture directly or indirectly on a glass substrate; curing the mixture through exposure to ultraviolet radiation or electron beams after its application; and firing the coating layer in an oven at a temperature of from about 550 to 700° C. for a duration of from about 1 to 10 minutes.

In an example embodiment of this invention, there is provided a method of making a coated article comprising: a glass substrate; a photocatalytic and hydrophilic coating provided on the glass substrate; wherein the photocatalytic and hydrophilic coating comprises at least a layer produced using a method comprising the steps of: mixing a photomonomer comprising at least one radiation curable monomer capable of polymerization through exposure to ultraviolet radiation or electron beams with a titanium alkoxide to form a mixture; applying the mixture directly or indirectly on a glass substrate; curing the mixture through exposure to ultraviolet radiation or electron beams after its application; and firing the coating layer in an oven at a temperature of from about 550 to 700° C. for a duration of from about 1 to 10 minutes.

DETAILED DESCRIPTION OF THE INVENTION

Figure 1:
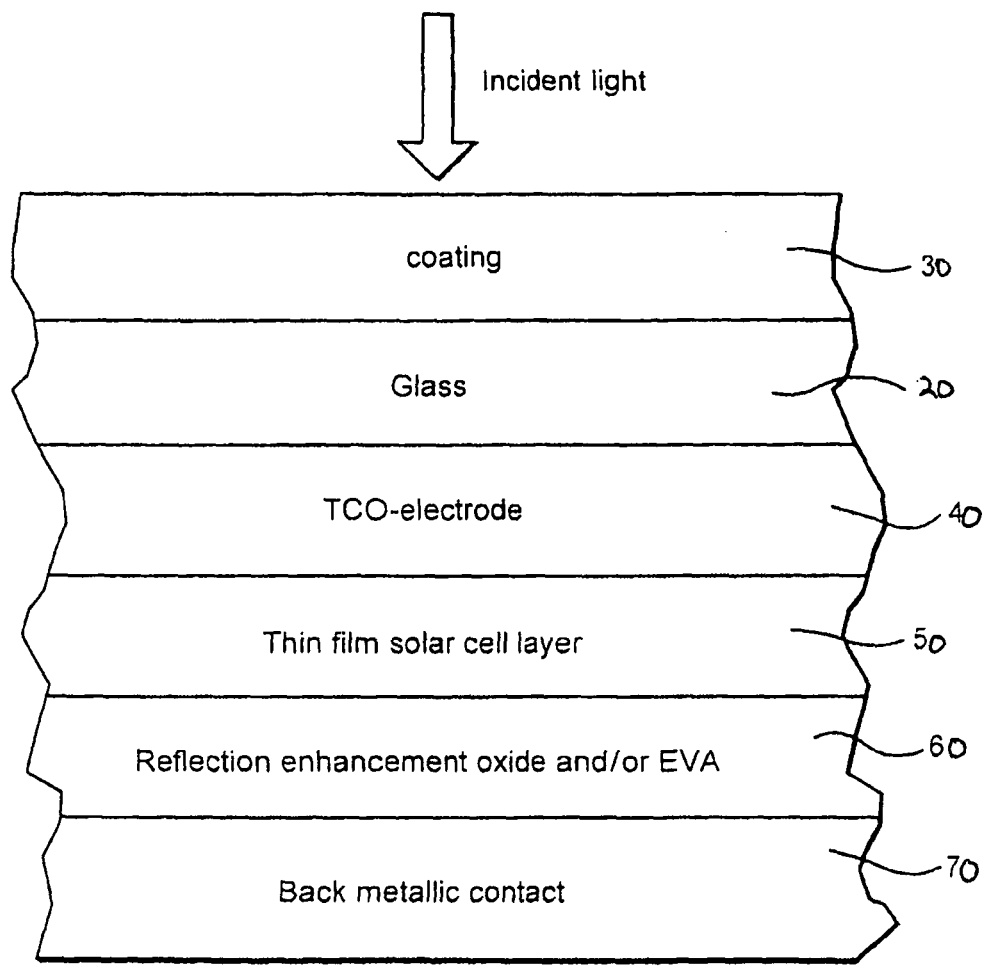
FIG. 1 generically illustrates a cross-sectional view of a photovoltaic device (e.g., solar cell), for converting light to electricity, according to an example embodiment of this invention.

In exemplary embodiments, there may be a substrate supports a coating layer that includes titania. In certain preferred embodiments, the substrate may have or exhibit heat-resistant properties. The substrate may, for example, comprise glass (e.g., soda-lime glass. The substrate may, for example, consist of a single material. Alternatively, the substrate may comprise multiple materials, preferably in layers. Although the substrate may directly support (that is, in direct contact with) a titanium dioxide layer, indirect or partial support are also contemplated. That is, the titanium dioxide coating may or may not be in direct contact with the substrate in different embodiments of this invention (e.g., there may be other layer(s) therebetween).

In some embodiments, the substrate comprises ordinary float glass, which may include additional amounts of soda ($Na_2O$), usually in the form of sodium carbonate or nitrate during the production process, lime (CaO) and other oxides (usually aluminum and magnesium oxides) to form a soda-lime-silica structure known colloquially as soda-lime glass. Other glass substrates can be prepared by the introduction of other additives and constituents.

Although described in connection with a glass substrate, certain embodiments relate to plastic or organic substrates instead of glass. In some embodiments, the substrate comprises a quartz, sapphire, and/or silicon. The substrate may comprise, for example, post-heat treatment laminates of plastic. For example, the substrate may comprise at least an outer layer of polyvinyl butyral (PVB) or other suitable polymer or glass-like component. In further embodiments, there may be a heat-resistant substrate that includes glass. That is, the substrate may be partially made from glass.

In some aspects, this invention relates to titanium dioxide coatings that may be provided for in coated articles used in devices such as photovoltaic devices, antifog mirrors, storefront windows, display cases, picture frames, greenhouses, other types of windows, and the like. In certain example embodiments (e.g., in photovoltaic devices), the titanium dioxide coating may be provided on either the light incident side or the other side of a substrate (e.g., glass substrate), such as a front glass substrate of a photovoltaic device. In other example embodiments, the titanium dioxide coatings described herein may be used in the context of sport and stadium lighting (as a coating on such lights), and/or street and highway lighting (as a coating on such lights).

In certain example embodiments of this invention, an improved coating is provided on an incident glass substrate of a solar cell or the like. This coating may have antireflective properties what function to reduce reflection of light from the glass substrate, thereby allowing more light within the solar spectrum to pass through the incident glass substrate and reach the photovoltaic semiconductor so that the solar cell can be more efficient. In other example embodiments of this invention, such a coating is used in applications other than photovoltaic devices (e.g., solar cells), such as in storefront windows, display cases, picture frames, greenhouse glass/windows, solariums, other types of windows, and the like. The glass substrate may be a glass superstrate or any other type of glass substrate in different instances.

In certain example embodiments of this invention, high transmission low-iron glass may be used for glass substrate in order to further increase the transmission of radiation (e.g., photons) to the active layer of the solar cell or the like. For example and without limitation, the glass substrate may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of coatings produced in accordance with the present invention may increase transmission of light to the active semiconductor film of the photovoltaic device and/or may have self-cleaning and/or antifouling properties.

Certain glasses for a glass substrate (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 1 below (in terms of weight percentage of the total glass composition):

TABLE 1

Example Additional Materials In Glass

| Ingredient | General (wt %) | More Preferred | Most Preferred |
| --- | --- | --- | --- |
| Total Iron (expressed as $Fe_2O_3$) | 0.001-0.06% | 0.005-0.04% | 0.01-0.03% |
| Cerium Oxide | 0-0.30% | 0.01-0.12% | 0.01-0.07 |
| $TiO_2$ | 0-1.0% | 0.005-0.1% | 0.01-0.04% |
| Erbium Oxide | 0.05-0.5% | 0.1-0.5% | 0.1-0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the substrate may be flat or patterned in different example embodiments of this invention.

FIG. 1 is a cross-sectional view of a photovoltaic device (e.g., solar cell), for converting light to electricity, according to an example embodiment of this invention. The solar cell of FIG. 1 uses a coating and glass substrate in certain example embodiments of this invention. In this example embodiment, the incoming or incident light from the sun or the like is first incident on coating 30, passes therethrough and through glass substrate 20 and front transparent electrode 40 before reaching the photovoltaic semiconductor (active film) 50 of the solar cell. Note that the solar cell may also include, but does not require, a reflection enhancement oxide and/or EVA film 60, and/or a back metallic contact and/or reflector 70 as shown in example FIG. 1. Other types of photovoltaic devices may of course be used, and the FIG. 1 device is merely provided for purposes of example and understanding. As explained above, the coating 30 reduces reflections of the incident light (and may inhibit agglomeration of large water droplets) and permits more light to reach the thin film semiconductor film 50 of the photovoltaic device thereby permitting the device to act more efficiently.

While certain of the coatings discussed above are used in the context of the photovoltaic devices/modules, this invention is not so limited. Titania coatings according to this invention may be used in many other applications, such as, for example, picture frames, fireplace doors, greenhouses, and the like.

Figure 2:
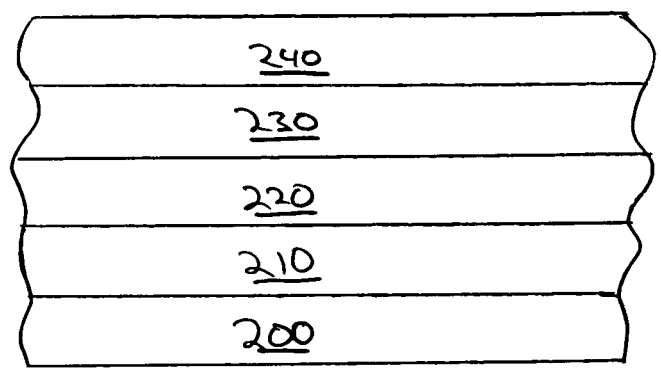
FIG. 2 generically illustrates a cross-sectional view of a multi-layer coating, according to an example embodiment of this invention.
Figure 3:
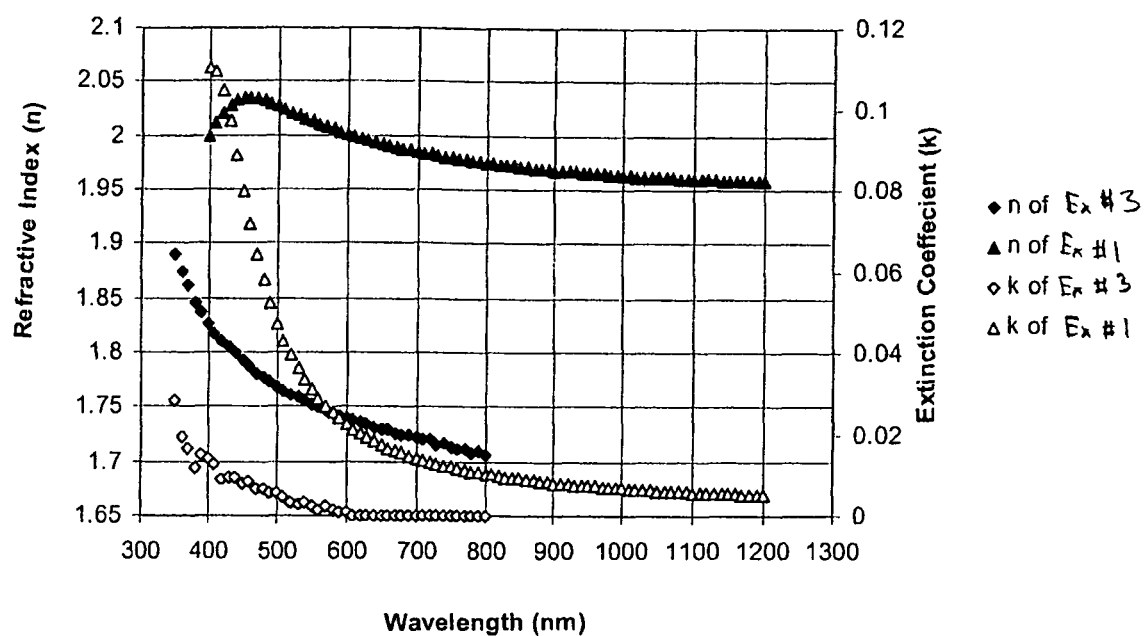
FIG. 3 provides a graph illustrating optical properties of exemplary embodiments of this invention.

For example, titania coatings according to this invention may be used in a multi-layer optical coating, such as illustrated in FIG. 2. FIG. 2 schematically illustrates a cross-sectional view of a multi-layer optical coating having substrate 200, which is preferably glass or glass-like. The light incident side may be either substrate 200 or layer 240. As illustrated, there are four layers that may have differing refractive indices. In an embodiment, layer 210 may have a high refractive index; layer 220 may have a low refractive index; layer 230 may have a high refractive index; and layer 240 may have a low refractive index. Alternatively, layer 240 is optional and may be omitted, and a three-layer optical coating may be formed. The optical coating may include layer 210 having a medium refractive index, layer 220 having a high refractive index, and layer 230 having a high refractive index. Of course, these layers may be reversed. The titania layer in accordance with the present invention may be any one of these layers, although the titanium dioxide layer may be exposed to humidity and/or other fouling-causing conditions.

As used in the preceding paragraph, a "high" refractive index is between 1.8 and 2.4 at 550 nm; a "low" refractive index is between 1.35 and 1.6 at 550 nm; and a "medium" refractive index is between 1.6 and 1.8 at 550 nm.

In certain embodiments, the titanium dioxide coating is made using a process involving a titania precursor and a photomonomer. The term "photomonomer" (or "photo-sensitive monomer" or "radiation curable organic monomeric material") should be understood to mean a radiation curable monomer, which also include further polymerizable oligomers and polymers. Rapid curing of such a monomer may result, for example, from any stimulus that generates free radicals and ions. For example, free radical initiation can be effectively provided by a source of UV light (or other electromagnetic radiation) or electron beams. In some embodiments, the polymerization reaction may be initiated wholly or partially through thermal or temperature by modifying or changing the initiator.

The photomonomer and/or photopolymer may basically comprise a polyester, acrylic, polyurethane or any of a number of general groups generally known to those skilled in the art. For example, the photomonomer and/or photopolymer may comprise UV-curable epoxies, UV-curable acrylates, and/or UV-curable isocyanates such as, for example, commercially available epoxies, acrylates, and/or isocyanates, including those available from Redspot, Vantec, Tangent, Dymax, Loctite, etc. In certain embodiments, the photomonomer and/or photopolymer may be Radur 401 UV clear from Van Technologies, MN, or UVB-370 supplied by Red Spot Inc., IN.

In certain preferred embodiments, titania precursor materials, such as titanium alkoxides, may be suitable to produce stable titania formulations. Titanium alkoxides, such as titanium isopropoxide, titanium n-butoxide, titanium tetra iso butoxide, titanium tetra isopropoxide, titanium tetra ethoxide, and their mixtures may be preferred. Other precursor materials of titania that contain chelating ligands, etc., may also be useful in certain embodiments. Titania precursor materials may be combined with organic monomeric materials and suitable catalysts or initiators to form stable titania precursor formulations.

Optionally solvents may be incorporated to adjust rheological characteristics as desired. Use of reactive diluents may be preferred to produce formulations containing 100% solids. Furthermore, colloidal dispersions of titania, silica, etc., in reactive diluents or in organic solvents may be incorporated into formulations. Titania precursor materials in the range from less than 1% to greater than 50% by weight (and all subranges therebetween) may be combined with organic monomers to form coating formulations. Precursor coatings may be formed by conventional wet coating techniques and curing may be at least partially caused through exposure to UV radiation.

In certain embodiments, the titanium dioxide coating may have any suitable thickness, e.g., from about 50 to 1500 nm.

In certain embodiments, the titanium alkoxide comprises—on a concentration expressed in terms of titanium dioxide—up to 10 wt % of the solution applied to the substrate, 0.5 to 5 wt % of the solution, and all subranges therebetween, 1 to 2 wt % of the solution, and all subranges therebetween. In other embodiments, greater and lesser amounts of the titanium alkoxide are contemplated. The titanium alkoxide may be supplied as a neat liquid or in a solution (e.g., dissolved in a solvent or as a colloidal dispersion).

In certain embodiments, the titanium dioxide coating layer comprises a silica from, e.g., a colloidal silica and/or a silane. Suitable silanes may include, for example, 3-methacryloxypropyl trimethoxysilane, tetraethyl-ortho silane, tetra ethoxy silane, methyltrimethoxysilane, methyltriethoxysilane, ethyltrimethoxilane, propyltrimethoxysilane, isobutyltrimethoxysilane, octatryethoxysilane, phenyltriethoxysilane, tetramethoxysilane, acetoxyproplytrimethoxysilane, 3 cyanopropyltriethoxysilane, and 3 glycidoxypropyl trimethoxysilane. In certain embodiments, the mole ratio of titania to silica may be 40-80 to 60-20 (and all subranges therebetween), 50-70 to 50-30 (and all subranges therebetween), or 60 to 40.

In certain example embodiments, the titanium dioxide coating is made from a process including a well-known solvent, such as an alcohol (e.g., n-propanol) and/or a ketone (e.g., methyl ethyl ketone). Other solvents known to those skilled in the art may also be used in various embodiments, including, for example, volatile hydrocarbon-based solvents, toluene, ethylene carbonate, gamma-butyrolactone.

In certain example embodiments, reactive diluents and/or low molecular weight monomers may be used.

The titanium dioxide coating may be applied as a liquid, then permitted to cure. In certain exemplary embodiments, the curing may occur through exposure to primarily UV radiation preferably for 5 to 120 seconds (and all subranges therebetween), more preferably for 10 to 90 seconds (and all subranges therebetween), and even more preferably for 30 to 40 seconds (and all subranges therebetween). In certain exemplary embodiments, the firing may occur in an oven at a temperature ranging preferably from 550 to 700° C. (and all subranges therebetween), more preferably from 575 to 675° C. (and all subranges therebetween), and even more preferably from 600 to 650° C. (and all subranges therebetween). The firing may occur for a suitable length of time, such as between 1 and 10 minutes (and all subranges therebetween) or between 3 and 7 minutes (and all subranges therebetween).

In addition, the composition of the atmosphere's gas may be controlled during curing; that is, the curing may occur, for example, in an inert atmosphere of nitrogen or argon or in an atmosphere or other suitable gas. Furthermore, partial curing is contemplated and included within the term "curing" and its variants.

Several examples were prepared, so as to illustrate exemplary embodiments of the present invention. Unless stated otherwise, all ingredients and components are available from Aldrich.

Although the examples describe the use of the spin-coating method, the uncured coating may be deposited in any suitable manner, including, for example, roller-coating, spray-coating, flow-coating and any other method of depositing the uncured coating on a substrate.

Similarly, although the examples describe the use of glass, any suitable heat-resistant substrate may be used in certain embodiments of the present invention.

EXAMPLE #1

In this example, 6 gm of UV-curable monomer mixture commercially available as Radur 401 UV clear from Van Technologies, MN, was mixed with 0.6 m titanium tetra n-butoxide from Johnson Matthey, 2 gm n-propanol, and 1 gm methyl ethyl ketone to form a stable titania precursor formulation. Concentration expressed in terms of titanium dioxide for this formulation is about 1.47% by weight. The resulting formulation is moderately viscous and particularly suitable for spin-coating and spray-coating processes to produce coatings. This spin-coating formulation was applied within minutes after it was prepared to soda lime glass substrates by spin coating method at 1500 rpm for 30 seconds. Coating was cured at room temperature by exposure to UV radiation, then fired at 625° C. for 4 minutes to form a titania coating. As shown in FIG. 2, the refractive index of the titania coating was measured to be 2.01 at 550 nm.

EXAMPLE #2

A stable coating formulation was prepared as described in Example #1, except that the UV-curable resin was UVB-370 supplied by Red Spot, Inc., IN. This was applied to soda lime glass substrates at 2000 rpm for 30 seconds. The coating was then cured by exposure to UV radiation to obtain about a 4 micron thick precursor coating. It was then fired at 625° C. for 4 minutes to obtain a high index titania coating of about 450 Å in thickness.

EXAMPLE #3

5 gm of the coating formulation described in Example #2 was combined with 0.15 gm of 3-methacryloxypropyl trimethoxysilane. The solid content expressed in terms of solids was about 2.14% and mole ratio of titania to silica was 60/40. This was applied to a soda lime glass substrate at 1500 rpm for 30 seconds. The coating was then cured by exposure to UV radiation to obtain an about 3.8 micron thick precursor coating. It was then fired at 625° C. for 4 minutes to obtain a medium index titania-silica coating. The refractive index of the coating as measured to be 1.75 at 550 nm, as shown in FIG. 2.

As described and claimed herein, all numerical values and ranges of numerical values are approximate and thus include a reasonable or insignificant amount of deviation from the stated numerical values.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article comprising an antireflection coating, the method comprising:
    mixing a photomonomer comprising at least one radiation curable monomer capable of polymerization through exposure to ultraviolet radiation or electron beam with a titanium alkoxide to form a mixture;
    applying the mixture directly or indirectly on a substrate to form a layer covering substantially all of a major surface of the substrate;
    first curing the layer by exposing substantially all of an outer surface of the layer to ultraviolet radiation or electron beam after its application for about 5 to 120 seconds; and
    subsequently firing the cured layer, so as to form an antireflection coating comprising at least a titania-inclusive layer on the substrate.

2. The method of claim 1, wherein the titanium alkoxide comprises titanium tetra n-butoxide.

3. The method of claim 1, wherein the step of mixing the photomonomer with the titanium alkoxide further includes mixing a silane.

4. The method of claim 3, wherein the silane comprises 3-methacryloxypropyl trimethoxysilane.

5. The method of claim 1, wherein the step of mixing the photomonomer with the titanium alkoxide further includes mixing at least one solvent.

6. The method of claim 5, wherein the at least one solvent comprises n_propanol and methyl ethyl ketone.

7. The method of claim 1, wherein the mixture comprises titanium alkoxide in an amount up to 10% by weight, in a concentration expressed in terms of titanium dioxide, of the mixture.

8. The method of claim 1, further comprising the step of forming a high index layer, a low index layer, or a medium index layer between the layer and the substrate.

9. The method of claim 1, wherein the substrate comprises a glass substrate.

10. The method of claim 1, wherein the step of firing the layer is carried out at a temperature of from about 550 to 700° C. for a duration of from about 1 to 10 minutes.

11. A method of making a coated article comprising an antireflection coating, the method comprising: mixing a photomonomer comprising at least one radiation curable monomer capable of polymerization through exposure to ultraviolet radiation or electron beam with a titanium alkoxide and a silane to form a mixture; applying the mixture directly or indirectly on a substrate to form a layer, wherein the layer substantially entirely covers a major surface of the substrate; and curing the layer through exposure of substantially all of an outermost surface of the layer to ultraviolet radiation or electron beam after its application for about 5 to 120 seconds, so as to form an antireflective coating comprising a titania and silica-inclusive layer on the substrate, wherein a molar ratio of titania to silica is from about 80:40 to 60:20; and after said curing, firing the layer in an oven.

12. The method of claim 11, wherein the coating layer is fired in an oven at a temperature of from about 550 to 700° C. for a duration of from about 1 to 10 minutes.

* * * * *